United States Patent [19]

Schoell et al.

[11] Patent Number: 5,318,449
[45] Date of Patent: Jun. 7, 1994

[54] METHOD AND APPARATUS FOR COMPUTER-AIDED DIAGNOSIS OF ENGINES

[75] Inventors: Edwin T. Schoell, Boronia; Carl D. Andrewes; Gary I. McLeish, both of Gympie, all of Australia

[73] Assignee: Electra International Pty. Ltd., Queensland, Australia

[21] Appl. No.: 773,562

[22] PCT Filed: Jun. 7, 1990

[86] PCT No.: PCT/AU90/00247
§ 371 Date: Nov. 8, 1991
§ 102(e) Date: Nov. 8, 1991

[87] PCT Pub. No.: WO90/15316
PCT Pub. Date: Dec. 13, 1990

[30] Foreign Application Priority Data

Jun. 7, 1989 [AU] Australia .............................. PJ4584

[51] Int. Cl.⁵ .............................................. G09B 19/14
[52] U.S. Cl. ..................................... 434/305; 434/219; 73/117.2; 364/424.03; 364/431.04; 340/517; 123/480
[58] Field of Search .................. 434/219, 224, 305; 364/424.03, 431.01, 431.03, 431.04, 551.01; 73/117.1, 117.2, 117.3; 123/478–480; 340/517

[56] References Cited

U.S. PATENT DOCUMENTS

| | | |
|---|---|---|
| 4,267,569 | 5/1981 | Baumann et al. |
| 4,375,672 | 3/1983 | Kato et al. ................ 73/117.2 X |
| 4,470,016 | 8/1984 | Palmer . |
| 4,532,593 | 7/1985 | Mouri et al. |
| 4,747,301 | 5/1988 | Bellanger . |
| 4,821,217 | 4/1989 | Jackson et al. |
| 4,975,846 | 12/1990 | Abe et al. .................. 364/424.03 |

FOREIGN PATENT DOCUMENTS

| | | |
|---|---|---|
| 0031005 | 2/1982 | Japan .................... 364/431.03 |
| 2213608 | 8/1989 | United Kingdom . |
| 2216291 | 10/1989 | United Kingdom . |

Primary Examiner—Richard J. Apley
Assistant Examiner—Joe H. Cheng
Attorney, Agent, or Firm—Nixon & Vanderhye

[57] ABSTRACT

Diagnosis of an electronically fuel-injected engine equipped with sensors connected to an on-board microcomputer. Use of a standard personal or portable computer and a connector for electrical connection to the sensors and the on-board computer. An interface device is connected between the connector and the computer to enable the computer to read the values of the operational parameters of the engine as detected by the sensors, and to perform a diagnostic software comparison of the measured values with predetermined values or ranges. The interface device is switchable to a selected sensor or the on-board computer under software control from the computer, and includes a multiple mode measurement device which is also selectively switched to a desired measurement mode by the computer. The computer is then able to selectively measure the operational parameters of the engine, test for correct operation, and display the appropriate diagnostic or tutorial instructions for fault location and rectification. The computer is also able to feed data to the on-board computer for testing same.

16 Claims, 13 Drawing Sheets

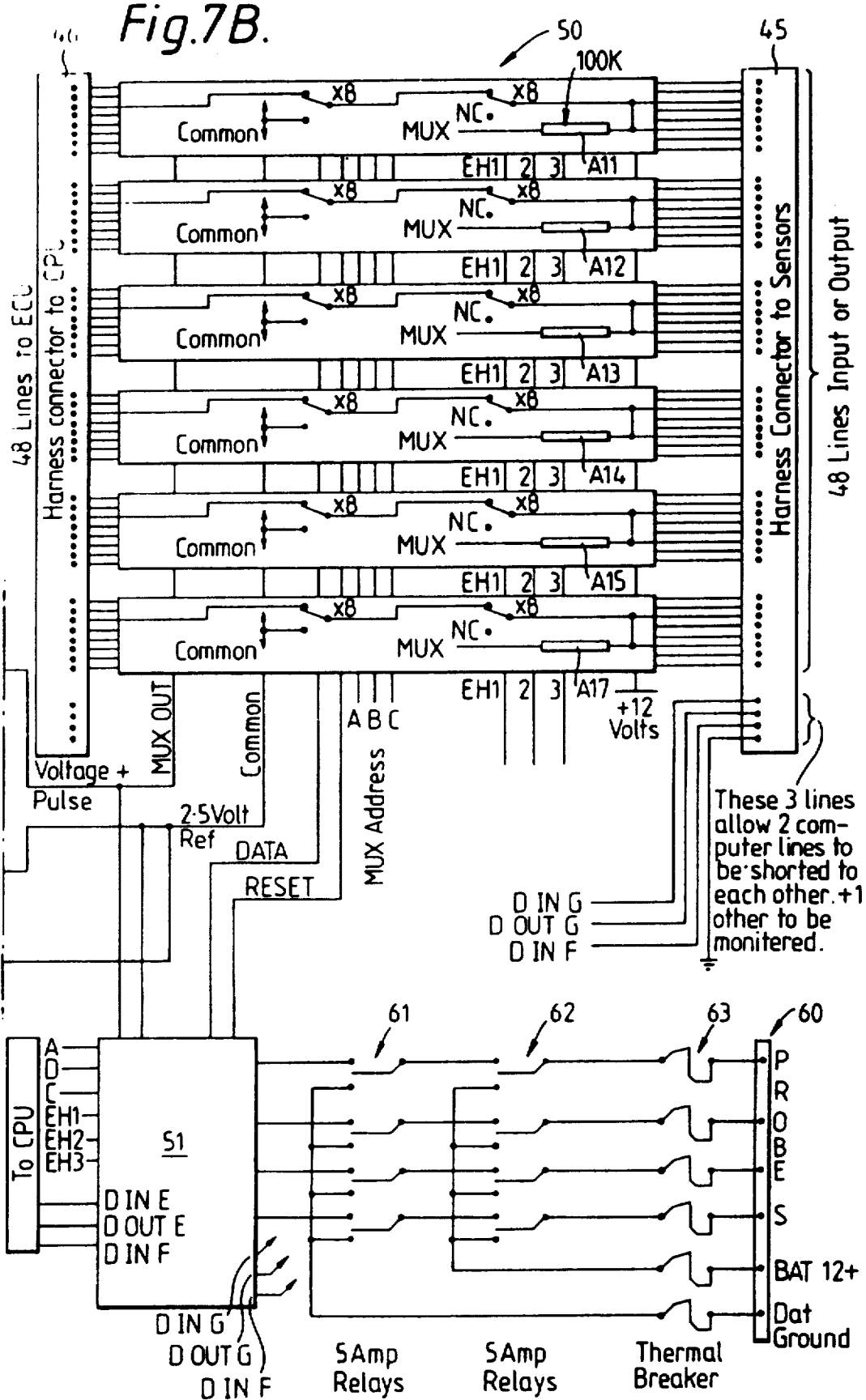

METHOD AND APPARATUS FOR COMPUTER-AIDED DIAGNOSIS OF ENGINES

This invention relates to a computerised diagnostic system for internal combustion engines. In particular, the invention is directed to a method of, an apparatus for, computer aided diagnosis of electronically fuel injected (EFI) internal combustion engines.

BACKGROUND ART

EFI engines in automobiles are commonly controlled by an on-board computer, typically a microprocessor-based device, which controls the timing and duration of the fuel injection in response to operational parameters sensed by a number of sensors on the engine, e.g. temperature, engine speed, throttle position, air flow, etc. These operational parameters can be measured many times per second so that the engine is continually operated at optimum efficiency.

Many microprocessor or micro-computer based control circuits for EFI engines are programmed to accept measured values of sensed operational parameters only when such values fall within a predetermined range e.g. to avoid responding to spurious signals or to avoid acting on faulty measurements. If the value of an operational parameter as measured by a particular sensor is outside the predetermined range, the sensor may be judged by the computer control system to have failed (whether this is, in fact, correct or not), and the actual output signal of the sensor may be replaced by a standard value (as described, for example, in U.S. Pat. No. 4,780,826). The use of a default value enables the engine to keep operating despite the failure of a sensor. However, although the engine will still operate, it will not perform as efficiently as it should. Since the fault in the engine may be masked by the default value inserted by the computerised electronic control system, it IS difficult, if not impossible, for mechanics to locate and correct the fault using conventional tools.

Complex and expensive diagnostic equipment is normally required to locate the fault. Such equipment is often computer-based, requiring a computer device manufactured specifically for that particular application. The use of such complex and specialized diagnostic equipment and the need for trained technicians result in increased costs for motor vehicle repair.

It is the object of the present invention to provide apparatus for computer-aided diagnosis of EFI engines which is within the economic and technical reach of most motor mechanics.

It is a further object of the invention to provide a method of computer-aided diagnosis of EFI engines wherein a diagnostic computer program includes tutorial information to enable such diagnosis to be performed by most motor mechanics.

SUMMARY OF THE INVENTION

In one broad form, the present invention provides apparatus for diagnosing an internal combustion engine, the apparatus comprising computer means having an associated display; input means for connection to the engine under test; and an interface device operatively connected between the computer means and the input means; wherein the interface device comprises:

multiple mode measurement means connected to the input means, the measurement means being responsive to control data received from the computer means to switch to a selected measurement mode, analog-to-digital converter means for converting a measured value of a selected operational parameter to digital form, and output means for outputting the digitized measured value to the computer means;

wherein in use, the computer means is programmed to perform a diagnostic comparison of the measured value with a predetermined operating range and to display the result of such diagnostic comparison.

In the event that the measured value of the operational parameter is outside the predetermined operating range, the computer means is preferably programmed to provide tutorial or similar information to assist the operator in locating and rectifying the possible fault. This procedure is repeated sequentially for all selected operational parameters.

Typically, the engine is an EFI engine and the operational parameters to be tested include battery voltage, ignition pulse, starter signal, throttle position sensor, air temperature sensor, air flow meter, coolant temperature sensor, fuel injectors.

The computer means may suitably be any one of a number of commonly available computers such as a standard laptop computer, or a personal computer, and no substantial hardware modification of such a computer is required. Thus the cost can be minimised. Further, the computer can be used for other applications when not required for EFI diagnosing.

The input means may be in the form of a probe which is placed in electrical contact with a selected sensor under test or other operational parameter, in accordance with instructions displayed on the computer display.

Alternatively, the input means may be in the form of a multipin socket which is connectable to the plug connected to the engine sensors. (This plug is normally connected to the on-board microcomputer found on modern vehicles having microcomputer-controlled EFI engines.) In this embodiment, the sensors are able to be examined rapidly and automatically for fault location.

In yet another embodiment, the input means is in the form of a multipin plug connected between the engine sensors and on-board microcomputer, and selectively switched under computer control. This enables rapid testing of not only the sensors, but also the on-board microcomputer.

To enable a standard portable or personal computer to be used in the diagnostic apparatus of this invention, an interface device is provided to interpret switching control data from the computer means and to convert the measured values of selected operational parameters into computer readable format. The interface device includes a multimode measurement device, analogous to a multimeter, which is controlled by the computer means to switch to the appropriate measurement mode for the selected operational parameter, e.g. voltmeter, ohmmeter, tachometer.

The measured value is converted to digital form and output by the interface device to the computer means, typically in serial data format.

The diagnostic comparison of the measured value with the predetermined range is then performed by the computer software and the results are displayed to the user, together with repair or troubleshooting instructions if necessary.

According to another aspect of the present invention there is provided a method of diagnosing an internal combustion engine using the above described apparatus, the method comprising the steps of sequentially measuring selected operational parameters of said engine, providing the measured values to the computer means, comparing the measured values with respective predetermined ranges stored in the computer means, displaying the results of such comparisons on the computer display, and displaying tutorial instructions for repair or troubleshooting in the event that measured values do not fall within their respective predetermined ranges.

In order that the invention may be more fully understood and put into practice, preferred embodiments thereof will now be described with reference to the accompanying drawings.

BRIEF DESCRIPTION OF THE DRAWINGS

FIGS. 7A and 7B is a schematic diagram of the interface current of FIG. 5.

DESCRIPTION OF PREFERRED EMBODIMENTS

Figure 1:
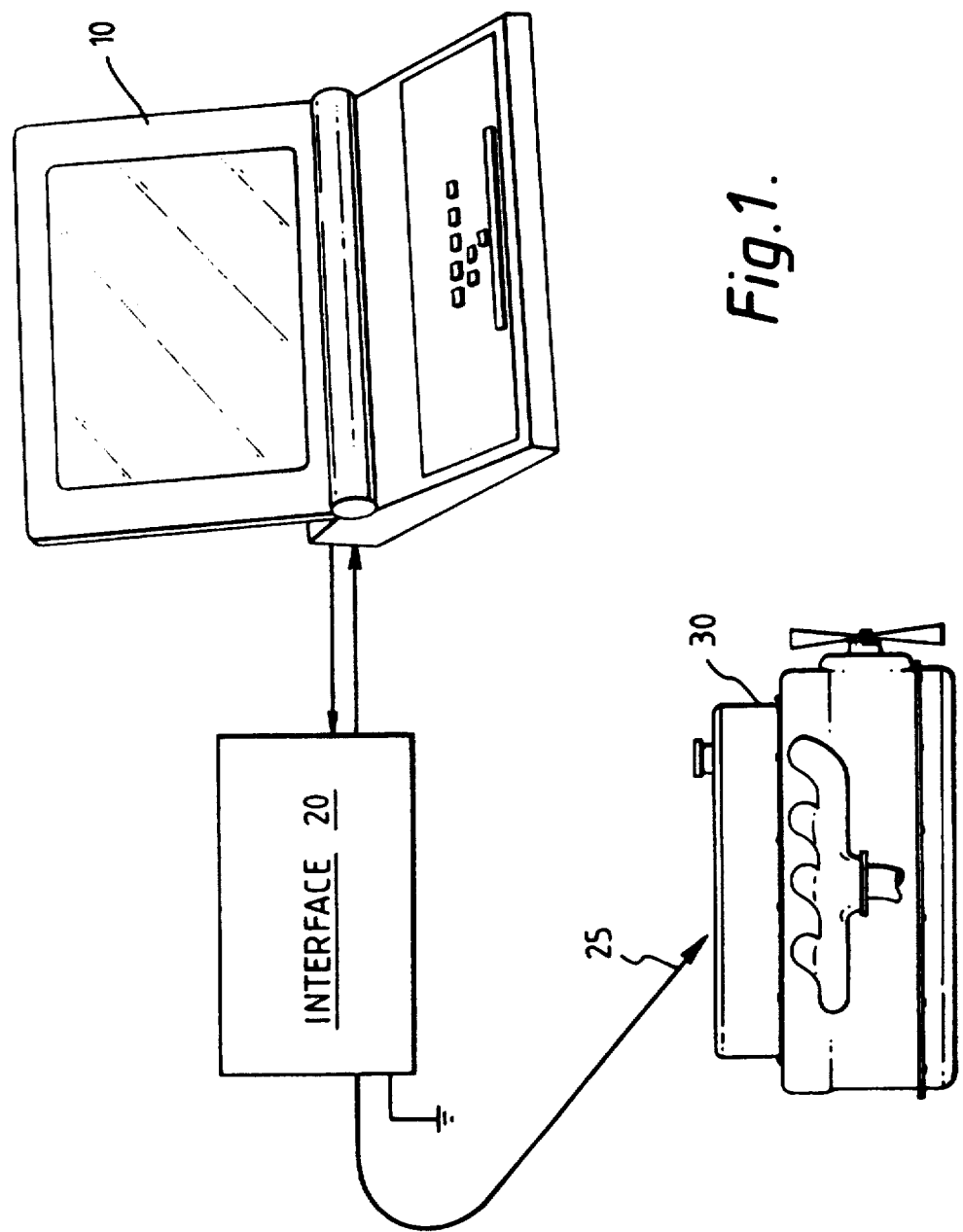
FIG. 1 is a schematic diagram of the basic components of the computer-aided diagnostic system of this invention.

As shown in FIG. 1, the diagnostic apparatus comprises computer means 10 which may suitably be a conventional portable or laptop computer. Alternatively, a standard personal computer (PC) may be used. Such computers are commonly available, and are within the financial reach of most motor repair garages. In the preferred embodiment, the computer means is a conventional portable computer 10 which is preferably housed in a robust casing designed to withstand the harsh environment of an engine workshop.

An interface device 20 is interposed between the engine 30 under test and the portable computer 10 to interpret switching control data from the computer means and to convert the measured values of operational parameters of the engine 30 into suitable digital form for input to, and processing by, the portable computer 10.

In a first embodiment of the invention (hereinafter referred to as the "manual" version), the interface device 20 is connected to the engine 30 by means of one or more probes 25. Typically, two probes are used, one probe being earthed, and the other probe 25 being placed manually at sensors at various locations on the engine 30 under test according to programmed instructions provided by the portable computer 10 on its associated display.

In a second embodiment of the invention, the input of the interface device 20 is connected to the multipin plug which normally connects the engine sensors to the on-board microprocessor controlling the operation of the EFI engine. In this embodiment, the input of the interface device 20 is switched automatically between the various sensors connected to the multipin plug, the switching being controlled by the portable computer 10. In this manner, in order to diagnose the engine 30, the operator need only remove the multipin plug from the microprocessor controller on board the vehicle and connect it, via a suitable connector lead or adaptor, to the interface device 20. The operational parameters measured by the individual sensors are then scanned sequentially and the measured data is fed via the interface 20 to the portable computer 10 for processing.

Operational parameters are measured in real time. Typically, the diagnostic software in the portable computer 10 is designed to compare the measured value of an operational parameter with a predetermined range. This range may be derived from manufacturer's specifications or by empirical determination. If the measured operational parameter is within the predetermined range, the diagnostic program will then proceed onto the next operational parameter. However, if the measured parameter is outside the allowable range, the program will then switch to tutorial mode to instruct the operator the required steps to locate and rectify the fault.

In a third embodiment of the invention, the input of the interface device 20 is interposed between the multipin plug and the on-board microprocessor so that not only can sensor information be received by the diagnostic computer, but also test valves can be fed to the on-board microprocessor to check the proper operation thereof.

Figure 2:
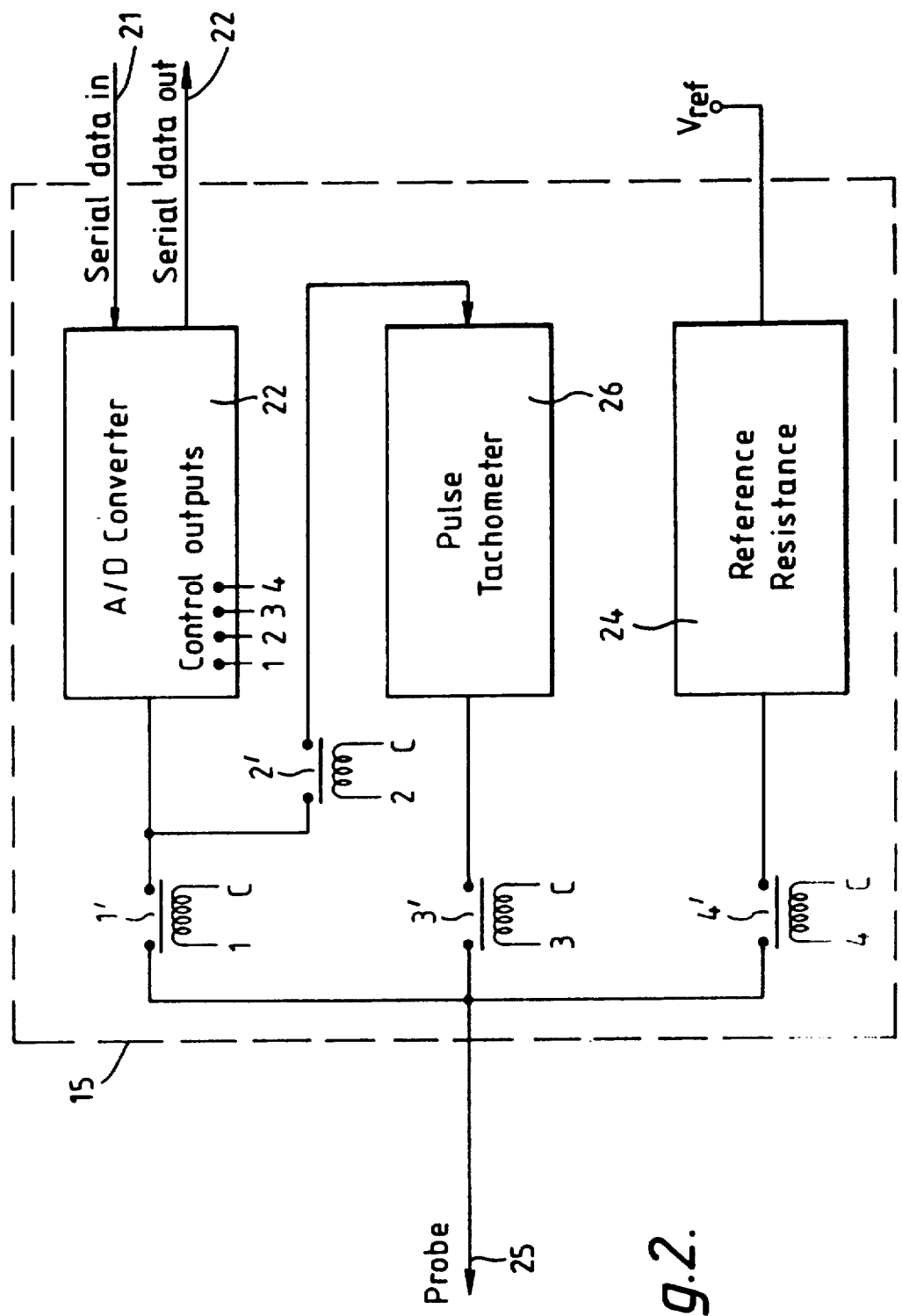
FIG. 2 is a schematic circuit diagram of the interface device of FIG. 1 according to a first embodiment of the invention.

A schematic circuit diagram of the interface device 15 of the manual version is shown in FIG. 2. The interface device 15 is basically a computer controlled multimeter which can operate as a voltmeter, ohmmeter or tachometer, together with an analog-to-digital converter 22 for converting measured valves to digital form. The interface circuit can be constructed at low cost and is suitable for small motor repair workshops.

In use, control data is fed from the portable computer 10 to the interface circuit 15 along "data in" line 21 in serial form. This control information is used to provide the required voltages at control outputs 1, 2, 3, 4 to actuate a switch, or combination of switches, 1', 2', 3', 4' to allow the interface 15 to operate in one of its voltmeter, ohmmeter or tachometer modes. (In the simplified schematic diagram shown in FIG. 2, the switches are shown in the form of solenoid relays. However, it will be appreciated by those skilled in the art that other suitable switching devices can be used, e.g. solid state switches.)

By way of example, if the battery is to be tested, the portable computer 10 will instruct the operator to connect the probe 25 to the positive battery terminal, the other probe (not shown) being earthed. The computer 10 will then transmit the required control data to the interface 15 via line 21 so that switch 1' will be closed, and the remaining switches 2', 3', 4' will be opened by control outputs 1, 2, 3, 4 respectively. In this manner, the voltage sensed by probe 25 will be fed directly to the analog-to-digital (A/D) converter 22 within the interface. (The interface device 15 suitably comprises appropriate ranging and shaping circuits (not shown) to place the measured voltage in a suitable condition for A/D conversion). The measured voltage is then converted to digital form and fed, in serial data format, to the computer 10 via line 23. The value of the battery voltage will then be compared with a predetermined range previously input to the computer.

If the measured battery voltage is outside the allowable range, a FAULT message is displayed on the screen. If not, the computer proceeds to the next test. For example, it may then display instructions to the operator to start the engine, with the probe 25 being left connected to the positive terminal of the battery. During this procedure, the battery starting and charging voltages will be measured and input to the computer 10 which compares them with predetermined ranges.

This procedure is continued, each operational parameter being checked sequentially to ensure that it is within a prescribed range.

If the operational parameter to be checked is in the form of a resistance (e.g. if it is necessary to test for open or short circuits), the interface device 15 is switched to ohmmeter mode. The control information fed by computer 10 along line 21 will cause the control outputs to close switches 1' and 4', and open all other switches. A reference voltage (Vref) is applied to a reference resistance 24 in order to derive a known current. This current is fed via switch 4' and probe 25 to the resistance being measured. The resulting voltage, which is proportional to the measured resistance, is input to the A/D converter 22 wherein it is converted to serial digital form and fed to computer 10 via output line 23. The reference voltage may be derived from a battery or reference voltage circuit within the interface device 15, or from an external source.

If engine speed is to be measured, the interface device 15 is switched to tachometer mode. In this mode, switches 2' and 3' are closed, and all other switches are open. The probe 25 is placed on a source of periodic pulses dependant on engine speed (e.g. by connecting to a spark plug, ignition coil or speed sensor). The periodic pulses sensed by probe 25 are fed to a pulse tachometer circuit 26 which provides an output voltage proportional to the frequency of the incoming pulses. The output voltage is fed via switch 2' to the input of the A/D converter 22 where it is again converted to serial digital form and fed to the computer 10.

The switching of the interface device 15 between its various voltmeter, ohmmeter and tachometer modes is performed automatically under computer control, and the transmission of control and measurement data between the interface 15 and computer 10 is governed by a suitable clock or timing mechanism. The operator need only shift the probe 25 as instructed by the programmed instructions displayed on the screen of the computer 10. No special training or expertise is required, and the required tutorial information is able to be displayed on the screen of computer 10.

The allowable range of selected operational parameters for various models of vehicles, together with diagnostic subroutines and tutorial information, can be stored on individual floppy discs, and purchased as and when required. This information can then be loaded into the computer before testing.

It will be apparent to those skilled in the art that the foregoing provides a low cost engine diagnostic system which is simple to use.

In the embodiment illustrated in FIG. 2, the probe is shifted manually from location to location to measure the required operational parameters sequentially. Although the interface circuit is of low cost design, the need to continually shift the probe 25 renders the diagnostic procedure somewhat lengthy. In order to obviate this problem, an automatic version of the interface circuit has been designed, and is illustrated schematically in FIG. 3.

Figure 3:
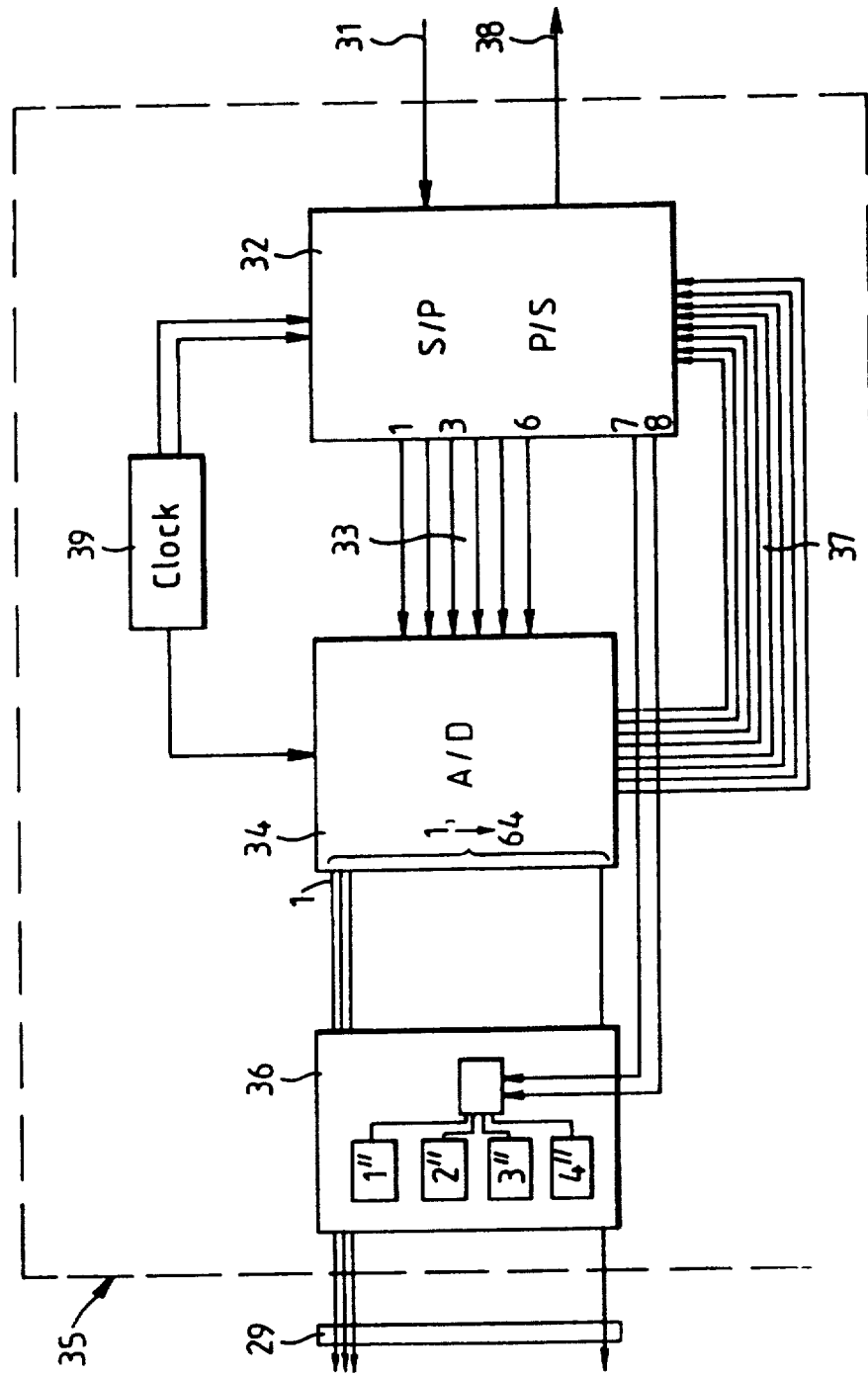
FIG. 3 is a schematic circuit diagram of the interface device of FIG. 1 according to a second embodiment of the invention.
Figure 4A:
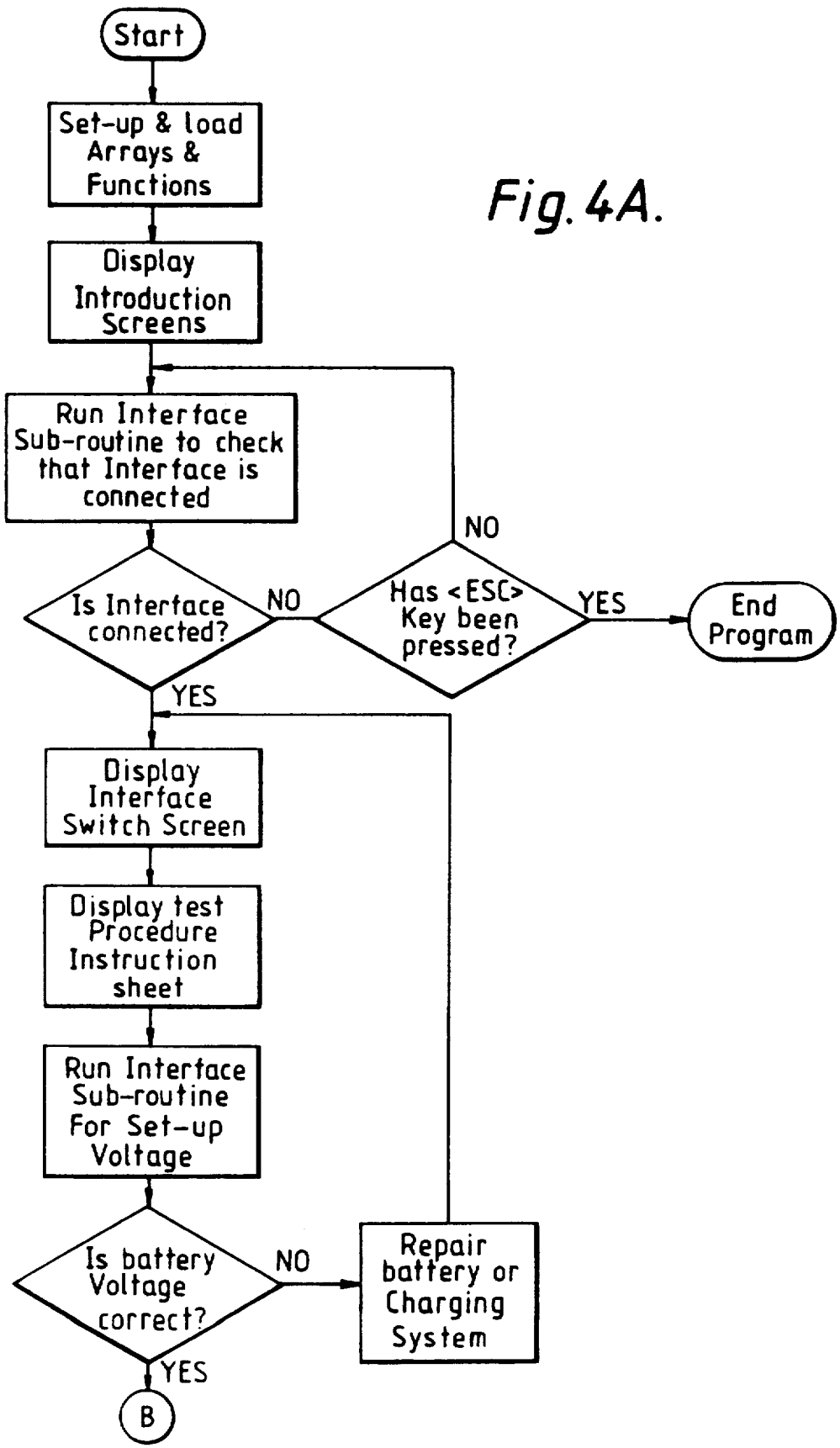
FIGS. 4A–4G is a flow chart of the diagnostic and tutorial software for use with the apparatus of FIG. 1.
Figure 4B:
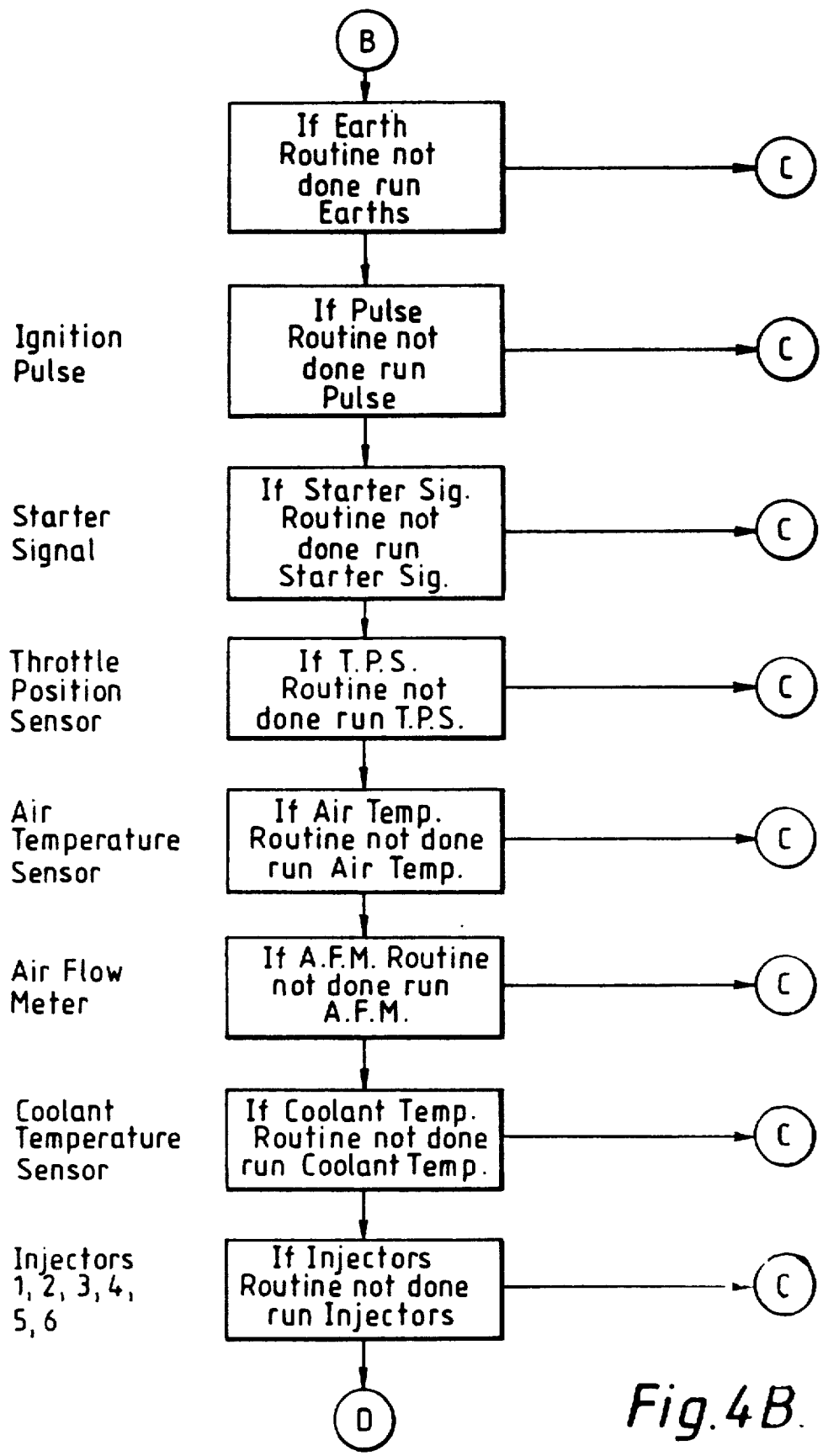
Figure 4C:
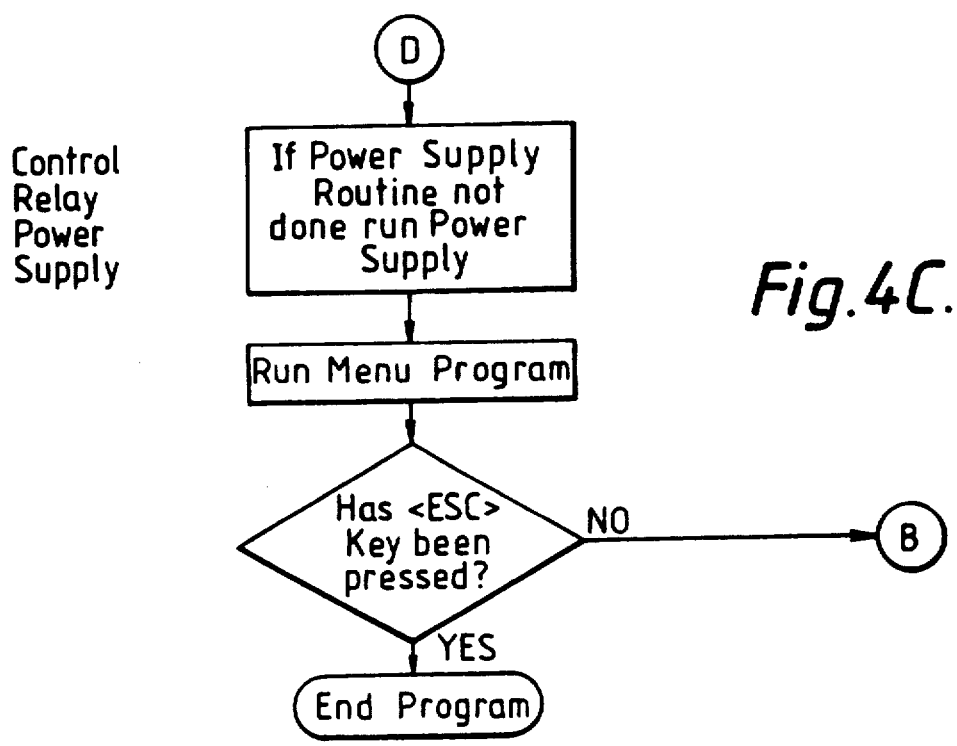
Figure 4G:
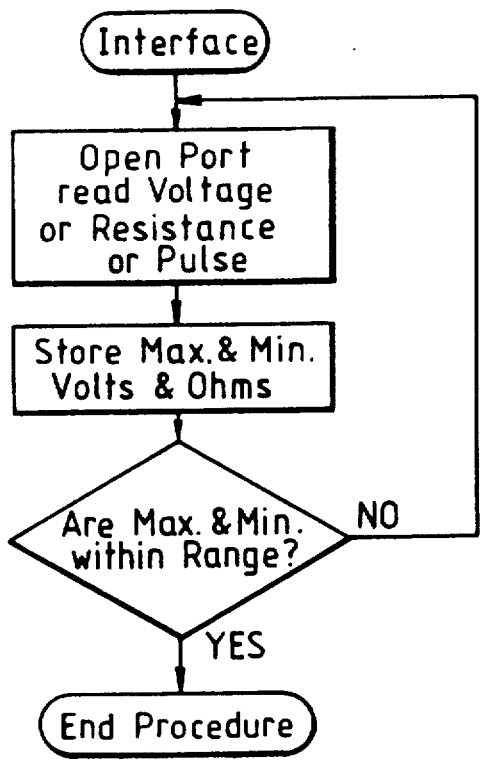
Figure 4D:
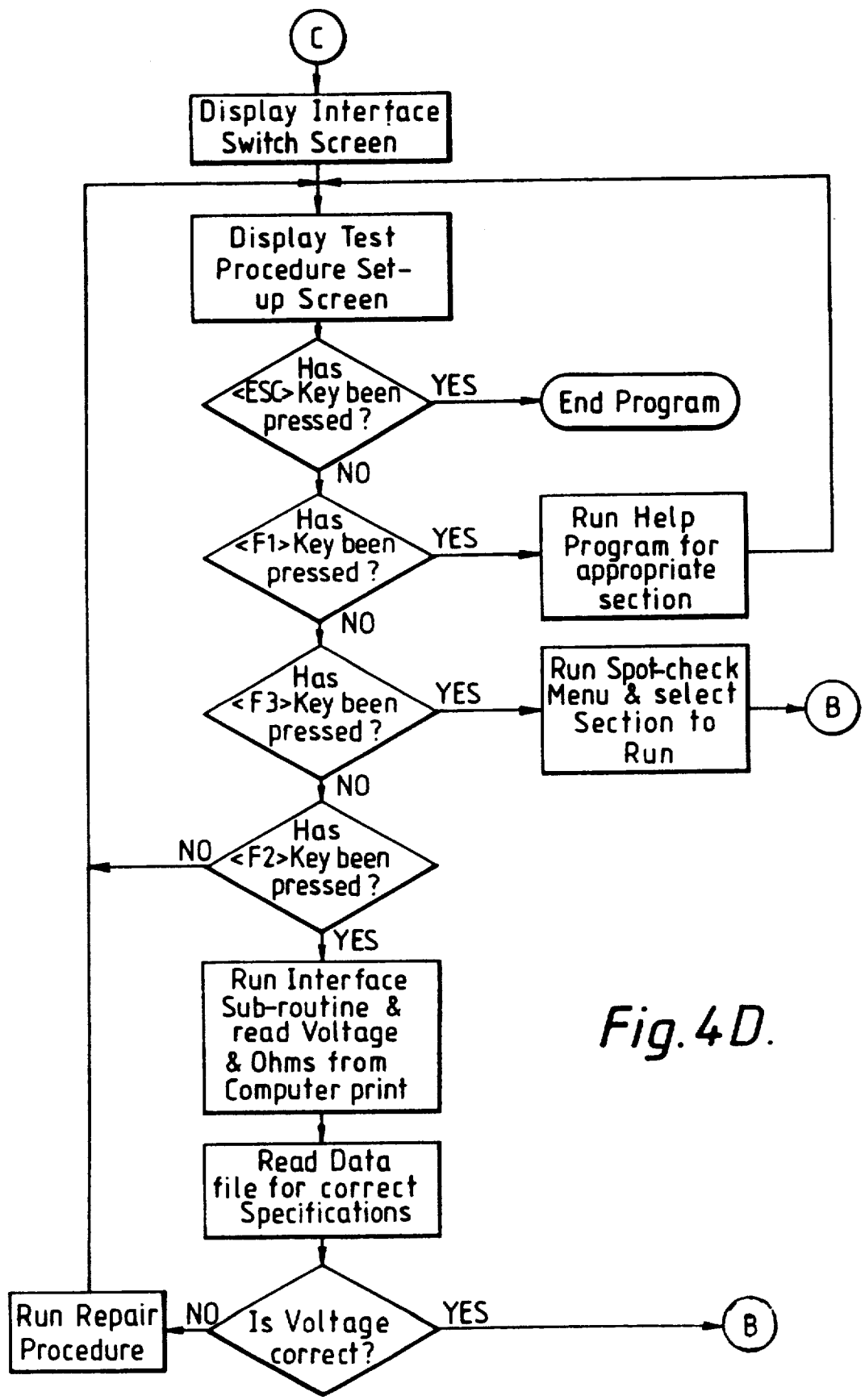
Figure 4E:
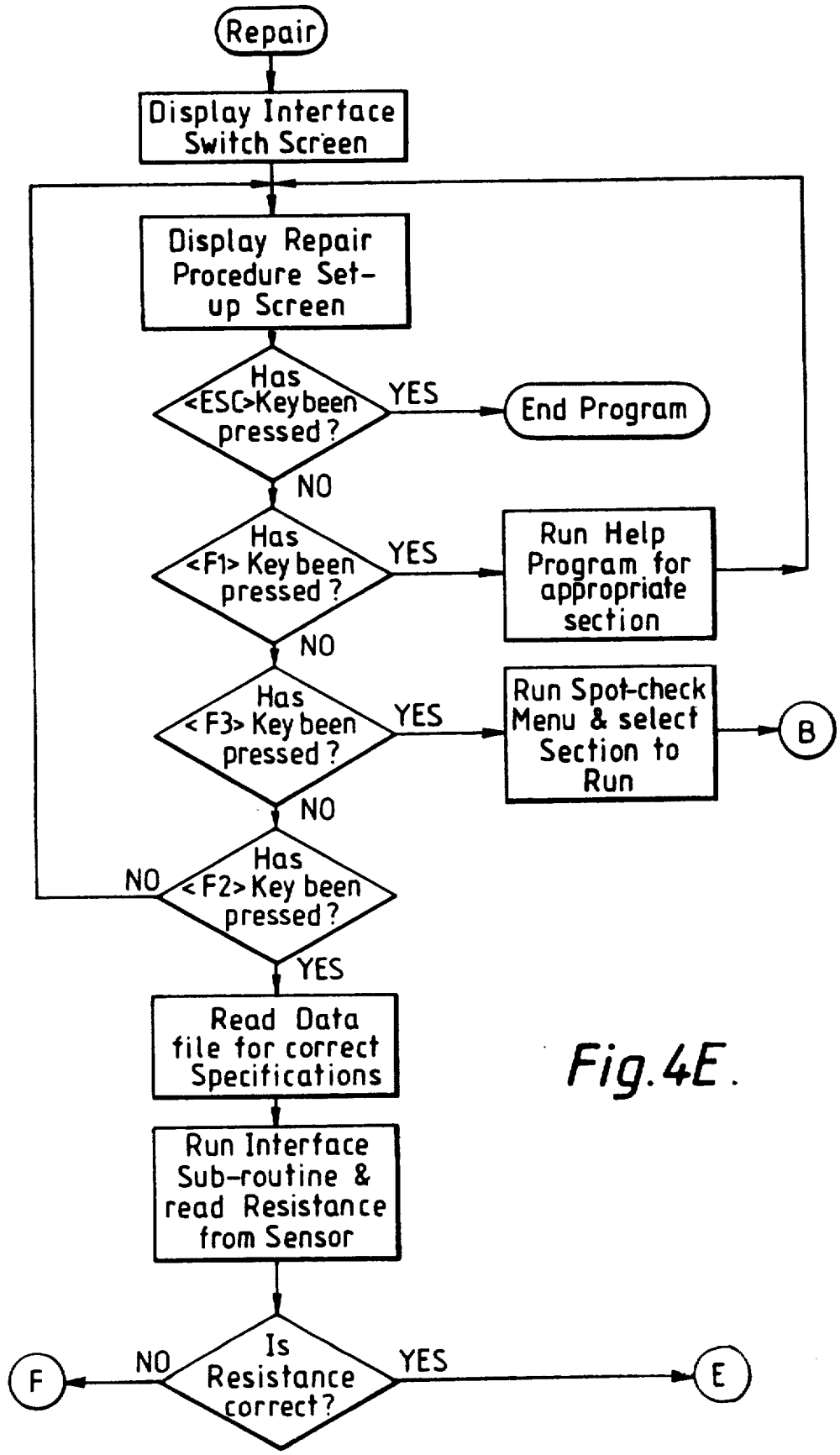
Figure 4F:
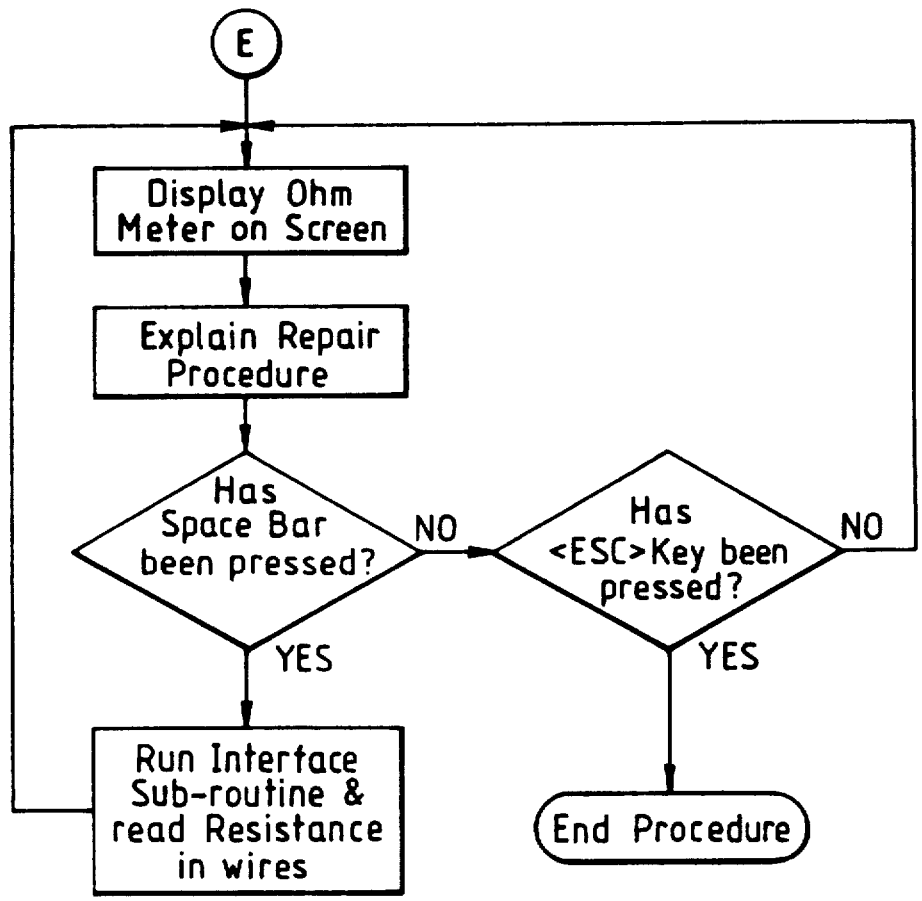
Figure 4F:
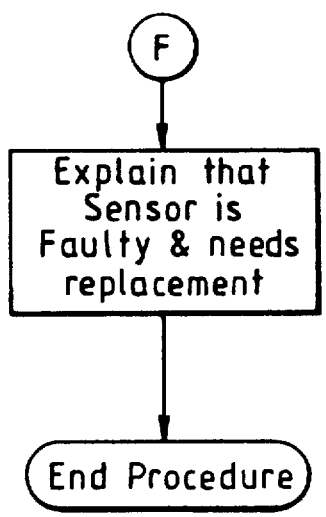

The automatic interface 35 of FIG. 3 is adapted to receive control data in serial form from portable computer 10 along line 31. The serial control data is converted to parallel form by a serial-to-parallel converter in circuit 32 within the interface 35. More specifically, the incoming serial data is converted into eight bit parallel form. The first six bits are fed via lines 33 to an A/D converter 34, and are used to select one of a possible 64 input lines to the A/D converter 34. The seventh and eighth bits are used to control the switching of four switches 1", 2", 3", 4" to select the appropriate mode a multimeter circuit 36, in a similar manner to that described above with reference to FIG. 2. In other words, for the selected one of a possible 64 input lines, the circuit 36 will measure the input as a voltmeter, ohmmeter or tachometer as the case may be. The input lines are connected to a multipin socket 29.

In use, the multipin plug connected to the various sensors on the engine is disconnected from the on-board microprocessor, and reconnected to the multipin socket 29. Control data output from the computer is used to select an appropriate incoming sensor line, i.e. the desired operational parameter, and to switch the multimeter device 36 to the appropriate measurement mode for the selected operational parameter.

The measured value on the selected line is converted into digital form by A/D converter 34, and fed (in parallel format) along lines 37 to a parallel-to-serial converter within circuit 32. The output serial data is then fed to computer 10 along output line 38. The switching of the A/D converter 34 and S/P, P/S converters 32 is also controlled by a clock 39.

Using the automatic interface circuit 35 of FIG. 3, the computer 10 can rapidly measure the operational parameters of the engine under test since no manual relocation of the probe is necessary.

The measured values of the operational parameters can be processed immediately and/or stored for subsequent analysis.

The computer can automatically compare all measured operational parameters with their respective allowable ranges, and provide a summary and fault analysis at the end of the diagnostic routine. Alternatively, the computer may measure each operational parameter individually and display the results of the diagnostic comparisons on the screen sequentially. Moreover, using a Select Menu, a particular sensor or operational parameter can be checked.

The automatic interface 35 is simple to use since the operator need only connect it to the on-board plug. Suitable adaptor sockets can be provided to suit the various models of plugs found on on-board microprocessors.

A flow chart of an example of suitable software for the computer 10 is shown in FIG. 4. The software is both diagnostic and tutorial in nature. In other words, it not only locates the fault, but provides repair instructions and trouble shooting advice.

After the computer program is loaded and the connections tested, each operational parameter or device is tested sequentially. As shown in the flow chart for this example, the battery voltage is first checked. If the battery voltage is not within the prescribed range, instructions are provided for repairing the battery or the charging system of the vehicle. The earthing, ignition, starter, throttle sensor, air temperature sensor, air flow meter, coolant temperature sensor, the injectors, relay and power supply are then tested sequentially.

For each test, tutorial information is provided on the screen of the computer to assist the operator in understanding the test being conducted. The operational parameter of the particular device under test is measured and compared with a predetermined range which has previously been entered into the computer memory. If the measured parameter is within the prescribed range, the program proceeds to the next test. If not, repair or trouble shooting instructions are provided on the screen for the operator.

For operational parameters which can be measured by the operator, the operator is able to ascertain whether the particular sensor measuring that operational parameter is operating correctly. For example, if the reading obtained from a particular sensor is outside the prescribed range, the operational parameter can be measured directly to ascertain whether it is, in fact, incorrect or whether the sensor is faulty.

By the process of elimination, the diagnostic equipment of the present invention can also be used to ascertain whether the on-board microprocessor is faulty.

Furthermore, by suitable programming, the diagnostic apparatus of the present invention can be used to test itself, i.e. to test whether the interface circuit is operating correctly.

Figure 5:
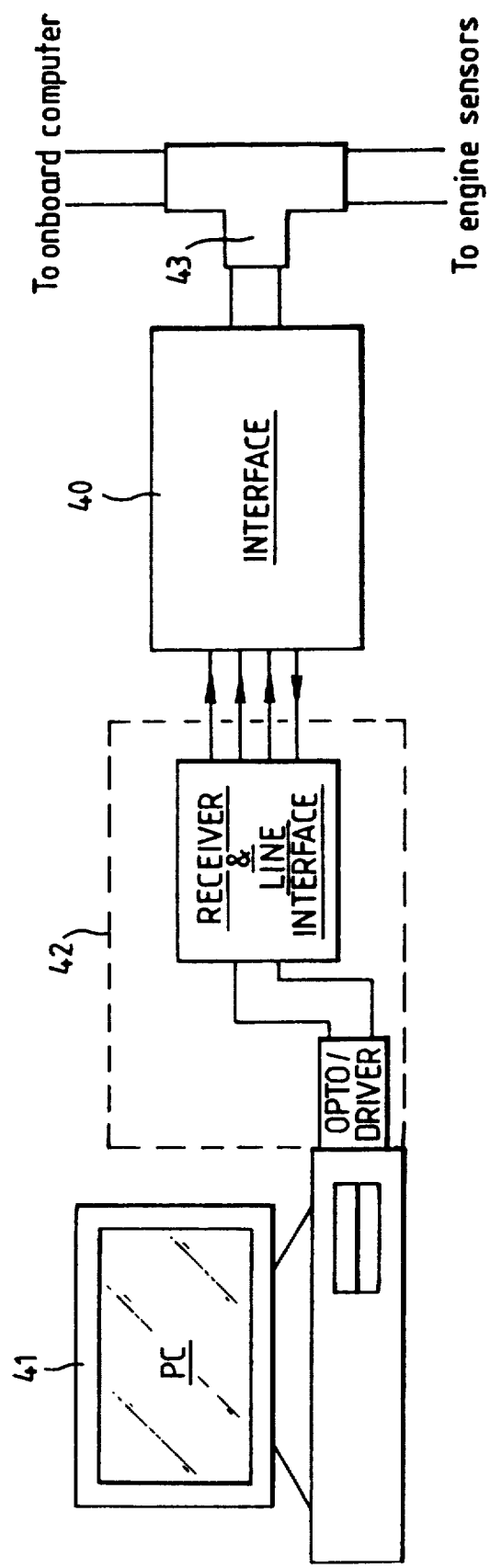
FIG. 5 is a schematic block diagram of a third embodiment of the invention.
Figure 6:
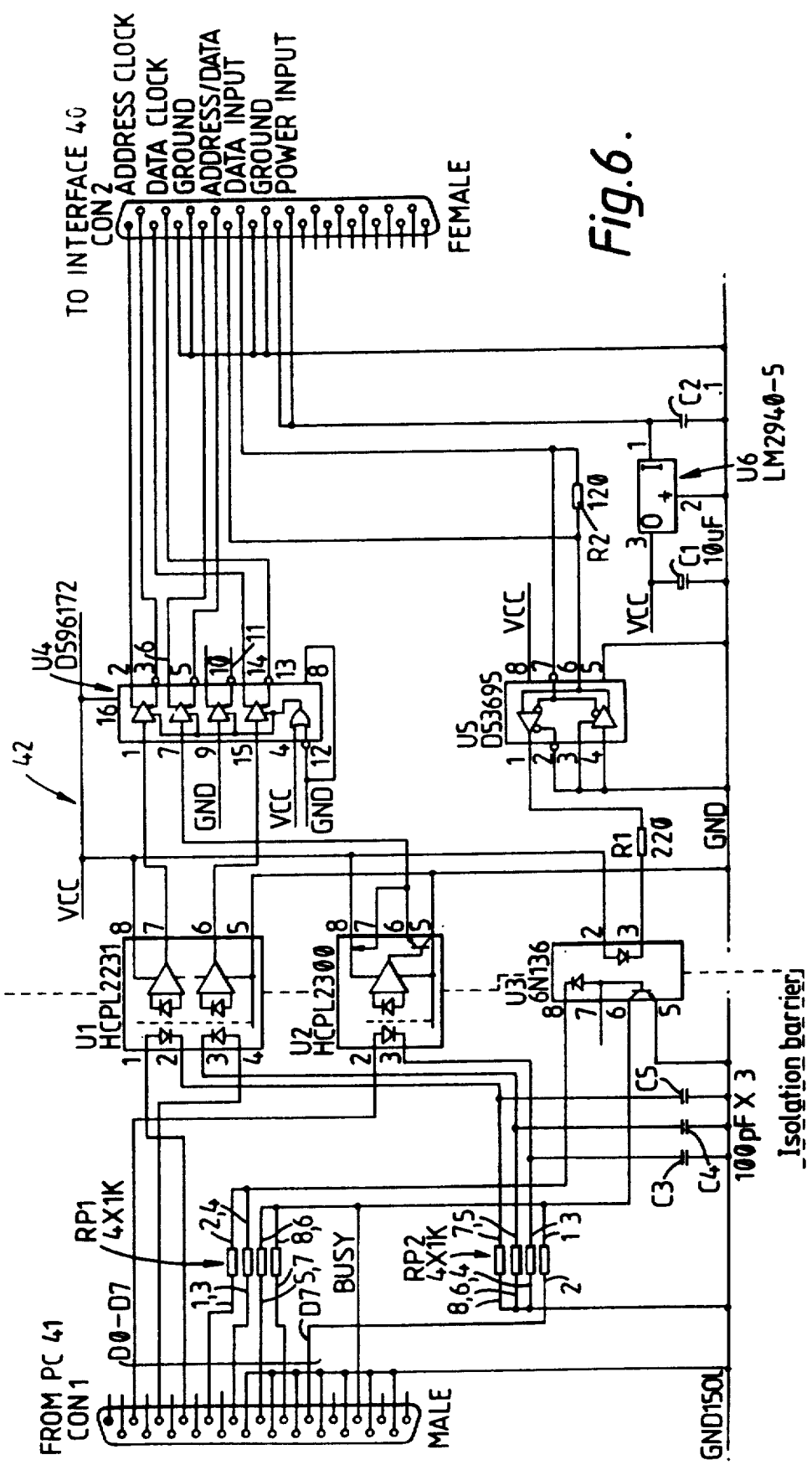
FIG. 6 is a circuit diagram of the coupling circuit of FIG. 5.

FIGS. 5 to 7 illustrate a third embodiment of the invention in which the input of the interface circuit is connected between the on-board microprocessor and the engine sensors. As shown in the schematic block diagram of FIG. 5, the interface circuit 40 of this embodiment is connected to a portable or personal computer ("PC") 41 via a coupling circuit and receiver/line interface 42, a circuit diagram of which is shown in FIG. 6. Circuit 42 provides optical isolation between the PC and the interface 40, and converts the signals to RS485 levels. The power for the RS485 signals is received from the interface circuit 40 via the data cable. The RS485 interface preferably has terminating resistors and a filtering network on each input line.

The interface 40 is connected, via coupling circuit 42, to a parallel input/output port of the PC, for example a printer port. In the illustrated circuit, the following signal lines of the parallel I/O port of the PC are used:

D0: Address/data line
D1: Data clock
D2: Address clock
D3: Power line for opto-isolators
D4): The system is enabled when these lines are
)
D5): high.
BUSY Return data (reads as BIT 7 on printer status)

The signals fed from the coupling circuit 42 to the interface 40 include ADDRESS/DATA, DATA CLOCK and ADDRESS CLOCK, while the signals received from the interface 40 include RETURN DATA.

The other end of interface 40 is connected between the plug or harness connector to which the engine sensors are connected, and the on-board microcomputer. A T-connector 43 is used to plug into the harness connector and the socket connected to the on-board computer. The T-connector 43 is typically provided in a variety of sizes and configurations to suit different models of automobile engine controllers.

Figure 7A:
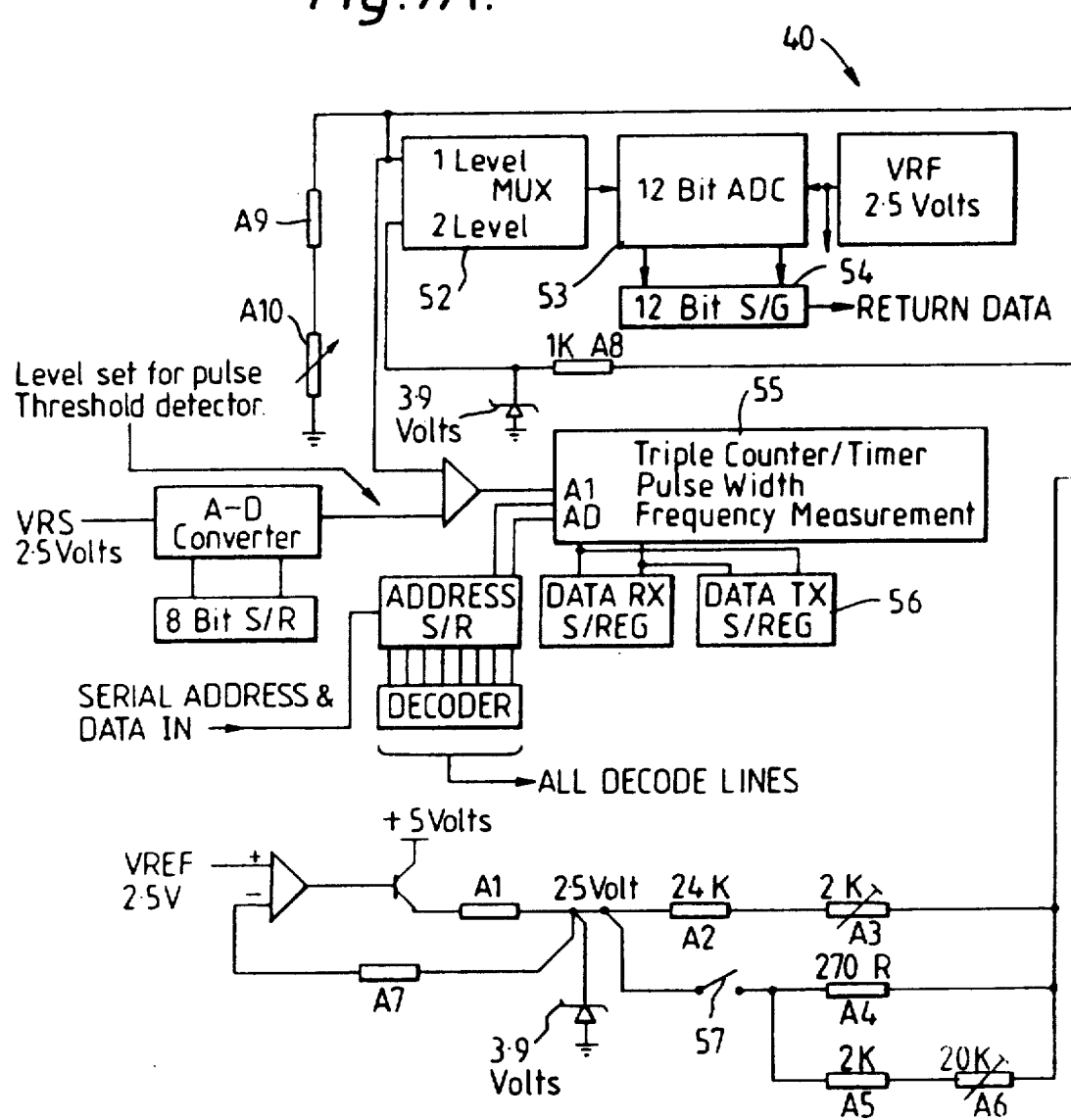

The interface circuit 40 is shown in more detail in FIGS. 7A and 7B. In the illustrated embodiment, the circuit has forty-eight line control circuits 50 (FIG. 7B) for switching between the connections to the engine sensors and the on-board microcomputer. However, it will be apparent to those skilled in the art that the number of line control circuits can be varied to suit the particular application of the interface. The forty-eight line control circuits 50 are housed on six boards of eight circuits each. To connect the interface 40 to a particular one of the 48 lines, the computer sends the appropriate address data to interface 40 via coupling circuit 42. The address data is clocked and decoded and switched to the appropriate address lines by addressing circuit 51. Address lines EH1, EH2, EH3 are used to select the particular one of the six cards to which the line is connected, while address lines A, B, C are used to select the desired one of the eight lines connected to that card.

As can be seen in FIG. 7B, the line control circuits 50 each include two relays connected in series between the sensor harness connector 45 and the on-board computer connector 46 for each of the forty-eight lines. A connection (MUX) is also made to each line via a 100K ohm resistor. By appropriate switching of the pair of relays interposed in each line, various measurements of sensor outputs can be taken, and information can be fed to the on-board computer.

When both relays in the selected line are "OFF", there is a direct connection between the sensor of that line and the on-board computer, i.e. a normal connection. Voltage and pulse measurements can be taken on the line in this mode, the measurements being output on the MUX OUT line. For voltage measurements, the output voltage is fed to a first input of a two-input multiplexer 52, the output of which is connected to a 12 bit analog-to-digital converter (ADC) 53. The digitized voltage reading is fed into a 12 bit shift register 54 from which it is transmitted to the RETURN DATA line to the coupling circuit 42 and hence the PC 41.

If pulse frequency measurements are to be taken, the output pulses on the MUX OUT line are first compared with a threshold level, and valid pulses are then counted by a suitable counter/timer circuit in signal processing circuit 55. The counter/time circuit used in the illustrated embodiment is a triple counter/timer comprising: a first timer set up as a rate generator dividing a 1 MHz signal down to 10 KHz; a second timer set up as a hardware triggered monostable using the 10 KHz as a reference, to produce a one second output pulse; and a third timer set up as an event counter, gated, for one second, by the first timer and counting the valid pulses received. The pulse frequency is then provided by the number of pulses received in the one second interval.

The interface circuit 40 can also be used to measure pulse length. In this case, valid pulses are fed to the signal processing circuit 55 where the triple counter/timer is set up such that the first timer serves as a rate generator dividing 1 MHz down to 100 KHz, the second timer is not used, and the third timer is set up as a pulse counter, preloaded with a maximum count. When the rising edge of the pulse is detected, the 100 KHz pulses from the first timer decrement the count in the third timer, until the falling edge of the pulse is detected. (No further pulses are allowed through to the counter when the next rising edge is received unless the pulse length measuring circuit has been reset). To ascertain the length of the detected pulse, the final count in the third counter is deducted from the maximum count originally entered into the counter to obtain the length of the pulse in increments of 0.01 milliseconds. When the pulse length measuring circuit is reset, the third timer is again preloaded with its maximum count.

The pulse frequency and/or pulse width measurements are transferred to DATA TX shift register 56 for transmittal to the PC 41 via the RETURN DATA line.

Open circuit voltage and pulse measurements can be taken by leaving the first relay (left hand relay as depicted in FIG. 7) OFF, i.e. maintaining the connection to the on-board computer, while switching ON the second relay (the right hand relay as depicted in FIG. 7B) to break the connection between the sensor line and the on-board computer.

To measure resistances, the relay states are reversed. That is, the second relay is switched OFF to maintain the connection to the sensor line, while the first relay is switched ON to break the connection to the on-board computer and connect the sensor line to the COMMON LINE. Resistance measurements between the sensor line and ground are taken in this mode. To obtain a resistance measurement, a 2.5 volt reference voltage is switched, via switch 57, through a selected one of two known resistances to the COMMON LINE (which has been switched to the sensor line). Typically, the known resistance is switchable between 25K ohm and 250 ohm. The voltage on the COMMON line is fed to the second input of two-input multiplexer 52 and converted to 12 bit digital format by ADC 53. The digitized value is fed to shift register 54 for transmission to the PC 41 via the RETURN DATA line. The unknown resistance on the sensor line is calculated using the following formula:

$$R \text{ (unknown)} = \text{(measured volts COMMON/2.5 volts COMMON)} \times \text{known resistance}.$$

The interface 40 also has connections for four manual probes 60 which can be placed at desired locations on the engine under test. Either 12 volts or ground can be selectively switched to the probes under computer control by the interface 40. As shown in FIG. 7B, the probe connections 60 are each connected to addressing circuit 51 via a respective pair of relays 61, 62. If the relay 61 of a particular probe is operated, that probe is connected to the 12 volt battery voltage of the vehicle. On the other hand, if the relay 62 of a probe is operated, the respective probe is connected to the vehicle ground. All probe connections to the addressing circuit 51 are protected by five Amp thermal circuit breakers 63.

It will be apparent to those skilled in the art that the interface circuit 40 enables the computer to address a particular sensor line and take measurements of voltage, pulse width and/or frequency and resistance on that line simply by switching of the appropriate relays. Selected voltages can also be switched to the manual probes under computer control. Thus, under control of appropriate software on PC 41, the interface circuit 40 is able to automatically access all sensor lines and take the appropriate readings, which are then relayed back to the PC for diagnostic assessment.

Furthermore, the sensor lines can be isolated, and specified values can be fed to the on-board microcomputer with resultant monitoring of the microcomputer output as evidenced by the engine performance. In this manner, the diagnostic system of the abovedescribed embodiment is able to not only locate faults in the engine sensors, but also in the operation of the on-board computer.

The foregoing describes only some embodiments of the invention, and modifications which are obvious to those skilled in the art may be made thereto without department from the scope of the invention as defined in the following claims.

We claim:

1. Apparatus for diagnosing an internal combustion engine having a plurality of sensors connected to an on-board microcomputer via a multiwire connector, the apparatus comprising: external computer means having an associated display screen; input means having a multiple input connector suitable for connection to the multiwire connector; and an interface circuit connected between the computer means and the input means, the interface circuit comprising a multiple-mode measurement means responsive to the computer means to switch to a selected measurement mode, a switching circuit responsive to the computer means to selectively connect the measurement means to a selected input of the multiple input connector, an analog-to-digital converter for converting to digital form the value, as measured by the measurement means, of an operational parameter sensed by a sensor corresponding to the selected input, and output means for outputting the digitised measured value directly to the computer means; wherein in use, the computer means is programmed to perform a diagnostic comparison of the measured value with a predetermined range and to display the result of such diagnostic comparison on the display screen.

2. Apparatus as claimed in claim 1 wherein the computer means is a portable computer.

3. Apparatus as claimed in claim 2 wherein the measurement modes of the measurement means include voltage, frequency and resistance measurement.

4. Apparatus as claimed in claim 1 wherein the input means also includes at least one manually positionable probe.

5. Apparatus as claimed in claim 1 wherein the computer means is programmed to automatically switch the measurement means successively to a plurality of inputs and to the respective measurement modes corresponding to those inputs.

6. Apparatus as claimed in claim 1 wherein the computer means is a general purpose personal computer.

7. Apparatus for diagnosing an internal combustion engine having a plurality of sensors connected to an on-board microcomputer via a two-part multiwire connector, the apparatus comprising: external computer means having an associated display screen; input means having a multiple input connector connected between the two parts of the multiwire connector, and first switching means responsive to the computer means for selectively connecting each input of the multiple input connector to a respective sensor and the respective sensor's connection to the on-board computer; and an interface circuit connected between the computer means and the input means, the interface circuit comprising a multiple-mode measurement means responsive to the computer means to switch to a selected measurement mode, second switching means responsive to the computer means to selectively connect the measurement means to a selected input of the multiple input connector, an analog-to-digital converter for converting to digital form the value, as measured by the measurement means, of an operational parameter sensed by a sensor corresponding to the selected input, and output means for outputting the digitised measured value directly to the computer means; wherein in use, the computer means is programmed to perform a diagnostic comparison of the measured value with a predetermined operating range and to display the result of such diagnostic comparison on the display screen.

8. Apparatus as claimed in claim 7, wherein the first switching means is also responsive to the computer means to connect a selected sensor to its respective connection to the on-board microcomputer.

9. Apparatus as claimed in claim 7, wherein the computer means is a portable computer.

10. Apparatus as claimed in claim 7, wherein the measurement modes of the measurement means include voltage, frequency and resistance measure.

11. Apparatus as claimed in claim 7, wherein the input means also includes at least one manually positionable probe.

12. Apparatus as claimed in claim 7, wherein the first switching means comprises a plurality of switching circuits each connected between a respective pair of terminals on the first and second parts, respectively, of the multiwire connector, each circuit being connected to a respective input of the multiple input connector and comprising two series-connected switches independently controllable by the computer means to connect each pair of terminals to each other and individually to the respective input.

13. Apparatus as claimed in claim 7, wherein the computer means is a general purpose personal computer.

14. A method of using the apparatus of claim 7 to diagnose an internal combustion engine having a plurality of sensors connected to an on-board microcomputer, the method comprising the steps of switching the first and second switching means under control of the computer means to connect the measurement means successively to selected sensors and the on-board microcomputer, and measuring operational parameters of the engine as sensed by the selected sensors, providing the measured values to the computer means, performing a software comparison of the measured values with respective predetermined ranges stored in the computer means, displaying the results of such comparisons on a computer display screen with tutorial instructions for repair in the event that a measured value does not fall within its respective predetermined range.

15. A method as claimed in claim 14, wherein the computer means is a portable computer.

16. A method as claimed in claim 14, further comprising the step of inputting data to the on-board microcomputer and measuring resultant operational parameters sensed by respective sensors.

* * * * *